US006741503B1

(12) United States Patent
Farris et al.

(10) Patent No.: US 6,741,503 B1
(45) Date of Patent: May 25, 2004

(54) SLM DISPLAY DATA ADDRESS MAPPING FOR FOUR BANK FRAME BUFFER

(75) Inventors: Jeffrey S. Farris, Flower Mound, TX (US); Alan Hearn, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/309,947

(22) Filed: Dec. 4, 2002

(51) Int. Cl.[7] .................................................. G11C 16/04

(52) U.S. Cl. ............................ 365/189.05; 365/230.03; 365/230.08

(58) Field of Search ....................... 365/230.03, 230.08, 365/189.05

(56) References Cited

U.S. PATENT DOCUMENTS 6,480,433 B2 * 11/2002 Huffman ..................... 365/201
2002/0085438 A1 * 7/2002 Wolverton .................. 365/200

* cited by examiner

*Primary Examiner*—Richard Elms
*Assistant Examiner*—Pho M. Luu
(74) *Attorney, Agent, or Firm*—Charles A. Brill; Wade James Brady, III; Frederick J. Telecky, Jr.

(57) ABSTRACT

A method of addressing double buffered memory for an SLM, the memory address having only two bank bits. It is assumed that the pixel data is formatted into bit-planes, such that pixel positions in each bit plane can be identified. A bit plane bit is mapped to a first bank bit, and a pixel position bit is mapped to a second bank bit. The read/write bit is mapped to a column address bit. The remaining bit plane and pixel position bits are mapped to row address and column address bits.

9 Claims, 1 Drawing Sheet

| RA11 | RA10 | RA9 | RA8 | RA7 | RA6 | RA5 | RA4 | RA3 | RA2 | RA1 | RA0 |
|---|---|---|---|---|---|---|---|---|---|---|---|
| BP5 | BP4 | POS14 | POS13 | POS12 | POS11 | POS10 | POS9 | POS8 | POS7 | POS6 | POS5 |

| BANK 0 | BANK 1 |
|---|---|
| BP2 | POS4 |

| CA7 | CA6 | CA5 | CA4 | CA3 | CA2 | CA1 | CA0 |
|---|---|---|---|---|---|---|---|
| RD/WR | BP3 | BP1 | BP0 | POS3 | POS2 | POS1 | POS0 |

SLM DISPLAY DATA ADDRESS MAPPING FOR FOUR BANK FRAME BUFFER

TECHNICAL FIELD OF THE INVENTION

This invention relates to display systems that use spatial light modulators (SLMs), and more particularly to memory devices for storing and delivering data to the spatial light modulator.

BACKGROUND OF THE INVENTION

A Digital Micromirror Device™ (DMD™) is a type of spatial light modulator (SLM). SLMs are characterized by their ability to display entire frames of data simultaneously, as compared to scanning devices such as cathode ray tubes. An LCD (liquid crystal display) is another familiar type of SLM.

Invented in the 1980's at Texas Instruments Incorporated, the DMD operates as a microelectromechanical system (MEMS) device, having an array of tiny individually addressable reflective mirrors. The DMD can be combined with image processing, memory, a light source, and optics to form a digital light processing system capable of projecting large, bright, high-contrast color images.

The DMD is fabricated using CMOS-like processes over a CMOS memory. Each mirror can reflect light in one of two directions depending on the state of an underlying memory cell. With the memory cell in a first state, the mirror rotates to +10 degrees. With the memory cell in a second state, the mirror rotates to −10 degrees. When the mirror surfaces are illuminated with a light source, the mirrors in the array can be set to one state or the other, such that "on" mirrors reflect light to one location and "off" mirrors reflect light to another location. For imaging applications, the "on" mirror elements reflect light to an image plane. The "on" state of the mirror appears bright and the "off" state of the mirror appears dark.

Grayscale is achieved by binary pulse width modulation (PWM) of the incident light. Color is achieved by using color filters, either stationary or rotating, in combination with one, two, or three DMD chips.

For simplicity, the PWM technique may be illustrated for a 4-bit word ($2^4$ or 16 gray levels). Each bit in the word represents a time duration for light to be on or off (1 or 0). The time durations have relative values of $2^0$, $2^1$, $2^2$, $2^3$, or 1, 2, 4, 8. The bit with the shortest interval (Bit 0) is called the least significant bit (LSB). The bit with the longest interval (Bit 3) is called the most significant bit (MSB). The period for displaying each frame of data is divided into four time durations of 1/15, 2/15, 4/15, and 8/15 of the frame period. The possible gray levels produced by all combinations of bits in the 4-bit word are $2^4$ or 16 equally spaced gray levels (0, 1/15, 2/15 . . . 15/15). Thus, for each frame of display data, the binary values of the "bit weights" that comprise each pixel's data determine the duration of time that the pixel will be "on" within that frame.

Visual artifacts can be reduced by a "bit-splitting" technique. In this technique, the longer duration bits are subdivided into shorter durations, and these split bits are distributed throughout the video field time. DLP displays combine pulsewidth modulation and bit-splitting to produce a "true-analog" sensation.

A frame memory is used to supply data to the DMD. The frame memory is comprised of DRAM memory devices, which typically operate in a "double buffer" mode. That is, one buffer is accessed for writing data into the frame memory, and a second buffer is accessed for reading data out of the frame memory to the DMD. Because of the manner in which the DMD displays data, the data must be available to the DMD according to pixel position and by the bit weight within each pixel "word".

SUMMARY OF THE INVENTION

One aspect of the invention is a method of addressing double buffered memory for an SLM, the memory address having only two bank bits. It is assumed that the pixel data is formatted into bit-planes, such that pixel positions in each bit plane can be identified. A bit plane bit is mapped to a first bank bit, and a pixel position bit is mapped to a second bank bit. The read/write bit is mapped to a column address bit. The remaining bit plane and pixel position bits are mapped to row address and column address bits.

An advantage of the invention is that it permits interleaving of three different frame memory operations: bit-plane writes, pixel position reads, and read/write toggling. This is accomplished in a four bank memory by using the two bank address bits for write and read interleaving, and placing the read/write address bit in the MSB of the column address. This has the added benefit of eliminating refresh requirements for low frame rates. The result is fewer overhead cycles, which makes faster load times possible, as well as reduced manufacturing time and cost.

DETAILED DESCRIPTION OF THE INVENTION

Figures 1, 2:
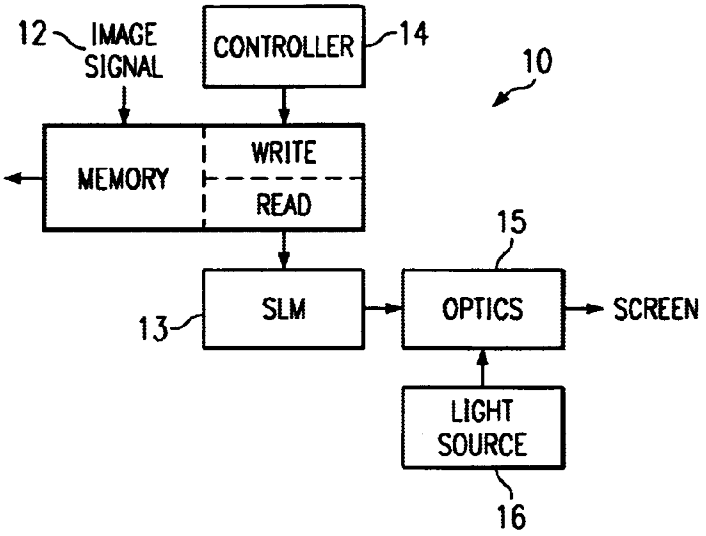
FIG. 1 illustrates the basic components of an SLM-based display system, having a memory and memory controller in accordance with the invention.
FIG. 2 illustrates the mapping of pixel data to memory addresses in accordance with the invention.

FIG. 1 illustrates the very basic design of an SLM-based display system 10. For purposes of this description, the SLM is assumed to be a DMD, but the same concepts apply to addressing a frame memory for any other type of SLM that uses a double buffer and is addressed by pixel position and bit weight.

Raw image data is received from a source, such as a computer memory or video or TV signal. This data may be received as fast as 30 frames per second, but the frame rate may be slower or faster. As explained below, the invention is useful for display systems having frame rates of a single frame per second or even slower.

A memory 12 receives the data, formats it for display, and delivers data to the SLM 13. More specifically, memory 12 stores the data temporarily while the controller 14 processes the images and readies the data for delivery to the SLM 13. A controller 14 handles the timing of the data and performs other control functions, including the control of the memory access operations described below. The SLM 13 generates images as discussed in the Background. An optics system 15 receives light from a source 16, and projects the image to a screen.

Memory 12 is includes storage of at least two frames of memory. That is, at least a portion of memory 12 is a frame memory and is double buffered. A read buffer stores data being written into the frame memory. A write buffer stores data being read from the frame memory to the SLM 13. This permits data to be read from memory 12 for a frame being currently displayed by SLM 13, while data for a next frame is being written to memory 12. As explained below, the two buffers are toggled by means of a read/write bit.

The present invention is directed to the mapping of pixel data to addresses in memory 12. As discussed in the Background, one implementation of memory 14 is with a DRAM device. Specific examples of suitable DRAM devices are SRAMs and DDR-SRAM's, although the techniques described herein are not limited to those types. A characteristic of today's DRAM devices is the use of multiple banks of memory. The method described herein is directed to four-bank memories, or other memories in which only two bits are available for bank addressing.

The use of multiple memory banks has led to a process known as interleaving, in which the memory controller alternates communication between two or more banks. Every time the controller addresses a memory bank, the bank needs about one clock cycle to "reset" itself. The controller can save processing time by addressing a second bank while the first bank is resetting. Interleaving produces a continuous flow of data, resulting in faster transfer rates.

Memory banks are further organized into pages. Interleaving is achieved by arranging data in memory so that when a page jump is made, it is always to a different bank. Thus, back to back operations on different pages on the same bank are avoided. For purposes of this description, pages correspond to row addresses; a jump to a new row address is equivalent to a page jump.

As indicated in the Background, the SLM 13 displays data according to pixel position and bit weight. Each frame period (the time for displaying a frame of display data) is divided into a number of time slices, and the values of the different bit weights determine the time slots during which a particular pixel is "on" during the frame period. If each pixel has an n-bit value, it has bit weights 0 . . . n. The nth bit weight of all pixels comprises a bit-plane, and there are n number of bit planes per frame. In the simplest PWM schemes, during the longest time slot, the MSB bit weights of all pixels are loaded to the SLM 13, and those pixels whose MSB is "1" are "on" during that time slot. In more complex PWM schemes, the display times for the MSM bit (and perhaps for additional bit weights) are split within the frame.

For implementing SLM frame memory 12, data is written into memory in bit-plane format. That is, the write data is ordered by bits of the same bit-weight. For example, Bit Plane 0 contains Bit 0 for each pixel of a frame. Writing is accomplished by incrementing through bit-plane address space.

Data is read from memory 12 by pixel position within a bit plane. As explained above, during a frame period, during a particular segment of the frame period, all bits of the same bit weight are displayed (on or off) at the same time. Reading is accomplished by incrementing through pixel position address space.

For purposes of this description, it is assumed that there are 64 bit-planes, identified with a six-bit address, BP(5:0), for bit-planes 0 to 63. There are approximately 1 million pixel position address bits, identified with a 15 bit address, POS(14:0). (Each pixel position is actually a segment of pixels). The read and write buffers are identified with a single Rd/Wr bit, which is either 0 or 1.

FIG. 2 illustrates an address map for memory 12, used for purposes of addressing frame memory 12 by controller 14. As indicated, memory 12 has a 12-bit row address, represented by bits RA0 . . . RA 11, and an 8-bit column address, represented by bits CA0 . . . CA7. There are also two bank address bits, identified as Bank0 and Bank1.

As further indicated in FIG. 2, the two available bank address bits are used for interleaved write bit-plane addressing and for interleaved read pixel position addressing. Mapping BP2 to a bank address bit ensures that there is a switch from one bank to another whenever BP2 changes value. Mapping POS4 to another bank address bit ensures that there is a switch from one bank to another whenever POS4 changes value.

As a result of using the two bank address bits for write and read interleaving, there is no bank address bit for read/write interleaving. Instead, the Rd/Wr bit is mapped to CA7, the most significant bit of the column address. Alternatively, the Rd/Wr bit could be mapped to CA6.

By mapping the Rd/Wr bit to a column address bit, the write data is refreshed every time controller 14 accesses a given page. Because each location on SLM 13 is cycled through many times per typical 60 Hz display frame, data on the read side will meet the maximum refresh period. This assumes a typical refresh period of 32 ms or less.

Write side pixel position bits are cycled through in a linear manner from the beginning of a write frame to the end. That is, the first pixel page is opened only at the beginning of a write frame. It is possible that for some applications, write frames can be less than 1 Hz. With the Rd/Wr bit in the MSB of the column address, the write data for the current bit quadrant being read is refreshed at the same moment the corresponding read data of the previous frame is read. This makes the write data self-refreshing on the read data's schedule, which is governed by PWM sequence and not by incoming data rates. This eliminates the need for refresh cycles for the write side. All that is required is to ensure that the read side PWM sequence accesses at least one location in each bit plane quadrant for every 32 ms period.

As indicated in FIG. 2, the least significant bits of both the bit plane address and the pixel position address are mapped to column addresses. Specifically, POS0–POS 3 are mapped to the least significant column address bits. POS 4 is mapped to a bank bit, causing a jump to a different bank. BP0, BP1, and BP3 are also mapped to column address bits, and a change to BP2 causes a jump to a different bank.

The remaining (more significant) bits are mapped to row addresses. In the example of FIG. 2, the two most significant bits of the bit plane bits are mapped to row address bits. The ten most significant bits of the pixel position bits are mapped to row address bits.

Other Embodiments

Although the present invention has been described in detail, it should be understood that various changes, substitutions, and alterations can be made hereto without departing from the spirit and scope of the invention as defined by the appended claims.

What is claimed is:

1. A method of addressing double buffered memory for an SLM, the memory address having only two bank bits, the method comprising the steps of:

mapping a bit plane bit to a first bank bit;

mapping a pixel position bit to a second bank bit;

mapping a read/write bit to a column address bit; and mapping the remaining bit plane and pixel position bits to row address and column address bits.

2. The method of claim 1, wherein the step of mapping a bit plane bit is performed by mapping the third bit plane bit.

3. The method of claim 1, wherein the step of mapping a pixel position bit is performed by mapping the fifth pixel position bit.

4. The method of claim 1, wherein the step of mapping a read/write bit is performed by mapping the bit to the most significant bit of the column address.

5. The method of claim 1, wherein the step of mapping a read/write bit is performed by mapping the bit to the second most significant bit of the column address.

6. The method of claim 1, wherein the four least significant bits of the pixel position bits are mapped to column address bits.

7. The method of claim 1, wherein the two least significant bits of the bit plane bits are mapped to column address bits.

8. The method of claim 1, wherein the two most significant bits of the bit plane bits are mapped to row address bits.

9. The method of claim 1, wherein the ten most significant bits of the pixel position bits are mapped to row address bits.

* * * * *